(12) United States Patent
Madia et al.

(10) Patent No.: US 12,002,860 B2
(45) Date of Patent: Jun. 4, 2024

(54) SEMICONDUCTOR DEVICE AND FABRICATION METHOD THEREOF

(71) Applicant: Taiwan Semiconductor Manufacturing Company, Ltd., Hsinchu (TW)

(72) Inventors: Oreste Madia, Hsinchu (TW); Georgios Vellianitis, Heverlee (BE); Gerben Doornbos, Kessel-Lo (BE); Marcus Johannes Henricus Van Dal, Linden (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/401,323

(22) Filed: Aug. 13, 2021

(65) Prior Publication Data

US 2023/0047356 A1    Feb. 16, 2023

(51) Int. Cl.
| | |
|---|---|
| *H01L 29/267* | (2006.01) |
| *H01L 21/28* | (2006.01) |
| *H01L 29/51* | (2006.01) |
| *H01L 29/66* | (2006.01) |
| *H01L 29/78* | (2006.01) |

(52) U.S. Cl.
CPC ...... *H01L 29/267* (2013.01); *H01L 29/40111* (2019.08); *H01L 29/516* (2013.01); *H01L 29/6684* (2013.01); *H01L 29/78391* (2014.09)

(58) Field of Classification Search
CPC ............ H01L 29/267; H01L 29/40111; H01L 29/516; H01L 29/6684; H01L 29/78391
See application file for complete search history.

(56) References Cited

U.S. PATENT DOCUMENTS

| | | | | |
|---|---|---|---|---|
| 6,130,455 | A | * 10/2000 | Yoshinouchi | ..... H01L 21/02422 257/349 |
| 2020/0144293 | A1 | * 5/2020 | Majhi | .................... H01L 29/516 |
| 2020/0176457 | A1 | * 6/2020 | Sharma | ................. H01L 29/516 |
| 2020/0321446 | A1 | * 10/2020 | Kim | ...................... H01L 29/516 |
| 2021/0151445 | A1 | * 5/2021 | Wagner | ................. H01L 29/516 |
| 2021/0226011 | A1 | * 7/2021 | Lee | ......................... H01L 29/778 |
| 2021/0408291 | A1 | * 12/2021 | Sharma | ............... H01L 27/2436 |

* cited by examiner

*Primary Examiner* — Julia Slutsker
(74) *Attorney, Agent, or Firm* — JCIPRNET

(57) ABSTRACT

A semiconductor device is provided. The semiconductor device includes a gate layer, a semiconductor layer and a ferroelectric layer disposed between the gate layer and the semiconductor layer. The semiconductor layer includes a first material containing a Group III element, a rare-earth element and a Group VI element, the ferroelectric layer includes a second material containing a Group III element, a rare-earth element and a Group V element and the gate layer includes a third material containing a Group III element and a rare-earth element. A method of fabricating a semiconductor device is also provided.

12 Claims, 17 Drawing Sheets

US 12,002,860 B2

SEMICONDUCTOR DEVICE AND FABRICATION METHOD THEREOF

BACKGROUND

A ferroelectric material includes a spontaneous electric polarization that can be reversed by changing an electrical field applied to the ferroelectric material, Ferroelectric materials have been used in devices in gate structures of a transistor or in capacitors. Conventional ferroelectric materials include lead zirconium titanate ($Pb(Zr_xTi_{1-x})O_3$ or PZT), hafnium dioxide ($HfO_2$ zirconium dioxide ($ZrO_2$), hafnium zirconium oxide ($Hf_xZr_{1-x}O_2$ or HZO), and ferroelectric polymers, such as polyvinylidene fluoride (PVDF).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
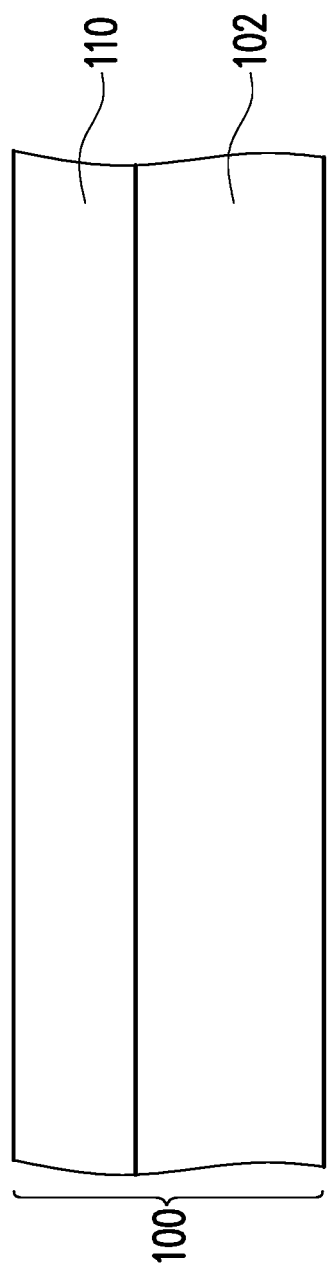
FIG. 1 through FIG. 7 are schematic cross-sectional views illustrating various stages in a fabrication method of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and other semiconductor devices. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

A ferroelectric field effect transistor (FeFET) is a transistor that includes a ferroelectric material which is employed as the gate insulator in a metal-oxide-semiconductor field effect transistor (MOSFET). Ferroelectric materials have a charge polarization that can be switched in direction by an applied electric field. The various embodiments disclosed herein utilize a field effect transistor structure that combines the semiconducting properties of a p-type aluminum scandium oxycarbide (AlScOC) layer and ferroelectric properties of an aluminum scandium nitride (AlScN) layer to form a thin-film transistor or a 3D transistor with stable and reliable ferroelectric response at scaled thicknesses. Further, various embodiments may also apply other p-type semiconducting oxide layer/ferroelectric layer pair systems, such as an aluminum scandium oxi sulfide (AlScOS) layer as a p-type oxide semiconductor layer and an aluminum scandium nitride (AlScN) layer as a ferroelectric layer. According to the disclosure, a p-type FeFET may be presented for the development of a full complementary circuit made entirely of oxides.

FIG. 1 through FIG. 7 are schematic cross-sectional views illustrating various stages in a fabrication method of a semiconductor device in accordance with some embodiments of the disclosure. The process of fabricating the semiconductor device according to some embodiments will be described in detail below. It will be appreciated that only a portion of the semiconductor substrate 100 is shown in FIGS. 1-8 for illustration purposes.

Referring to FIG. 1, in some embodiments, a semiconductor substrate 100 is provided. The semiconductor substrate 100 includes an oxide layer 110 formed over a substrate 102. The substrate 102 may be, for example, a material such as a glass, ceramic, dielectric, a semiconductor, the like, or a combination thereof. In some embodiments, the substrate 102 may be a semiconductor substrate, such as a bulk semiconductor or the like, which may be doped (e.g., with a p-type or an n-type dopant) or undoped. The substrate 102 may be a wafer, such as a silicon wafer (e.g., a 12-inch silicon wafer). Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In certain embodiment, the substrate 102 may be a sapphire substrate. The oxide layer 110 may be, for example, a silicon oxide or the like.

Figure 2:
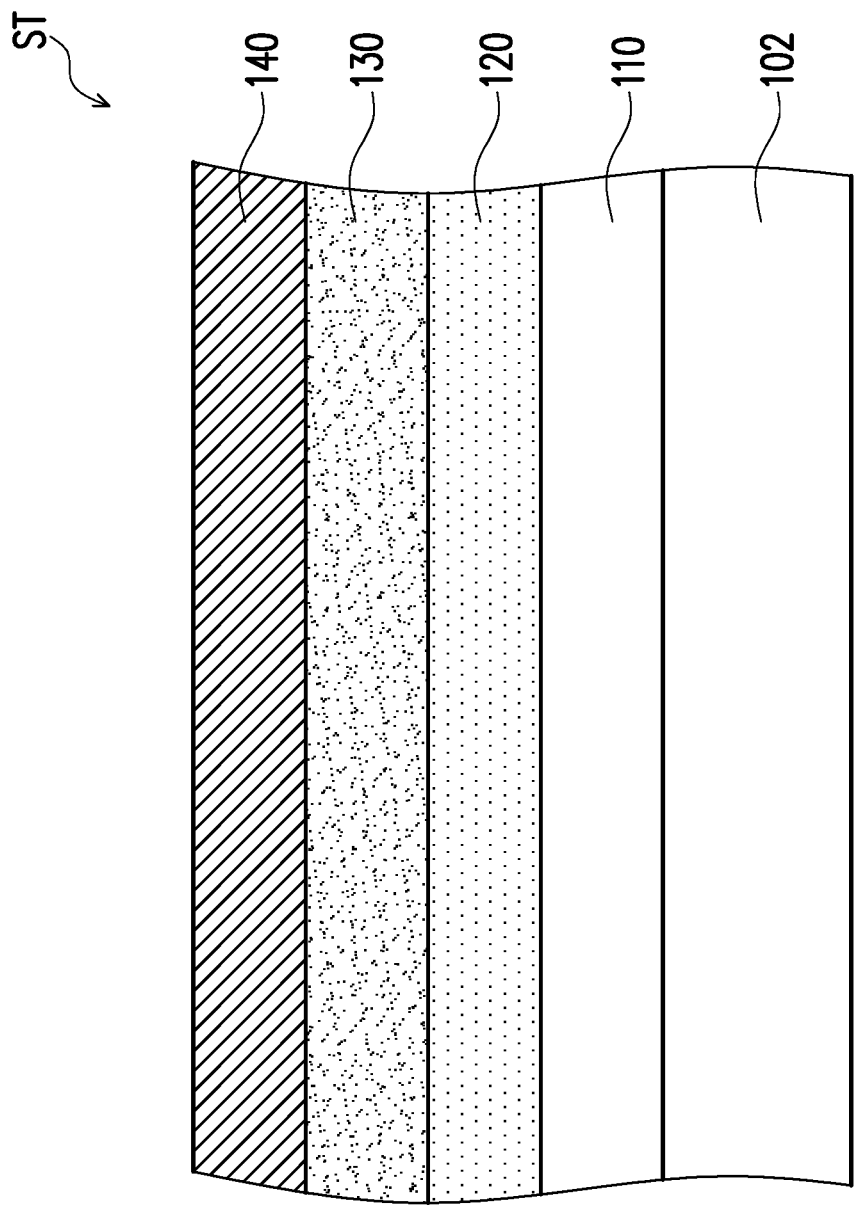

Referring to FIG. 2, a semiconductor material layer 120 is formed over the semiconductor substrate 100 (e.g., over the oxide layer 110). For example, the semiconductor material layer 120 may be formed by chemical vapor deposition (CVD), such as plasma enhanced CVD (PECVD), low-pressure CVD (LPCVD), metal organic CVD (MOCVD), or atomic layer deposition (ALD). In some embodiments, the semiconductor material layer 120 is formed by epitaxy growth such as molecular beam epitaxy (MBE). In some other embodiments, the semiconductor material layer 120 is formed by physical vapor deposition (PVD) such as evaporation, sputtering or ion plating.

In some embodiments, the semiconductor material layer 120 includes p-type oxide semiconductor material which is served as the p-type channel material. For example, the semiconductor material layer 120 may include a rare-earth-doped Group III-oxycarbides or a rare-earth-doped Group III-oxysulfides, such as scandium-doped Group III-oxycarbides or scandium-doped Group III-oxysulfides. In one embodiment, the semiconductor material layer 120 is made of aluminum scandium oxycarbide (AlScOC). Alternatively, the semiconductor material layer 120 may be made of aluminum scandium oxysulfide (AlScOS) in accordance with some embodiments.

In some embodiments, the semiconductor material layer 120 is an AlScOC layer (or AlScOS layer) having a scandium (Sc) content ranging from about 10% to about 50% (atomic percentage). That is, the semiconductor material layer 120 is a AlScOC layer (or AlScOS layer) with a Se content equivalent to or larger than 10% and equivalent to or smaller than 50% (i.e. 10%≤Sc≤50%), and the AlScOC layer (or AlScOS layer) may be denoted as $Al_{(1-x)}Sc_xOC$ (or $Al_{(1-x)}Sc_xOS$), where 0.1≤x≤0.5. In some embodiments, the semiconductor material layer 120 may be formed as a single layer with varying Sc contents or Sc content gradients. In alternative embodiments, the semiconductor material layer 120 may be formed as multiple layers with different Sc contents or Sc content gradients. In addition, with the Sc gradient of the semiconductor material layer 120 changing from the oxide layer 110 toward the above ferroelectric material layer, the lattice constant of the semiconductor material layer 120 is gradually changed from the oxide layer 110 toward the above layer in accordance with some embodiments, which may be benefit for its electrostatic stability and conductivity performance.

In some embodiments, after forming the semiconductor material layer 120, a ferroelectric material layer 130 is formed over the semiconductor material layer 120 and the semiconductor substrate 100. For example, the ferroelectric material layer 130 may be formed by CVD, such as PECVD, LPCVD, MOCVD, or ALD. In some embodiments, the ferroelectric material layer 130 is formed by epitaxy growth such as MBE. In some other embodiments, the ferroelectric material layer 130 is formed by PVD such as evaporation, sputtering or ion plating.

In some embodiments, the ferroelectric material layer 130 includes ferroelectric material composed of the same or similar constituents of the semiconductor material layer 120, to which may be served as the gate dielectric material with ferroelectric properties. For example, the ferroelectric material layer 130 may include a rare-earth-doped Group III-nitrides, such as scandium-doped Group III-nitrides. In one embodiment, the ferroelectric material layer 130 is made of aluminum scandium nitride (AlScN).

In some embodiments, the ferroelectric material layer 130 is an AlScN layer having a Sc content ranging from about 10% to about 60% (atomic percentage). That is, the ferroelectric material layer 130 is a AlScN layer with a Sc content equivalent to or larger than 10% and equivalent to or smaller than 60% (i.e. 10%≤Sc≤60%), and the AlScN layer may be denoted as $Al_{(1-x)}Sc_xN$, where 0.1≤x≤0.6. The AlScN layer may be a crystalline layer as it is grown on the crystalline semiconductor material layer 120 with minimal strain. In some embodiments, the ferroelectric material layer 130 may be formed as a single layer with varying Sc contents or Sc content gradients. In alternative embodiments, the ferroelectric material layer 130 may be formed as multiple layers with different Sc contents or Sc content gradients.

Subsequent to the deposition of the ferroelectric material layer 130, a metallic material layer 140 is formed over the ferroelectric material layer 130, the semiconductor material layer 120 and the semiconductor substrate 100 to form a layer stack structure ST. For example, the metallic material layer 140 may be formed by CVD, such as PECVD, LPCVD, MOCVD, or ALD. In some other embodiments, the metallic material layer 140 is formed by PVD such as evaporation, sputtering or ion plating.

In some embodiments, the metallic material layer 140 is made of aluminum scandium (AlSc) alloy. For example, the metallic material layer 140 is an AlSc alloy layer having very little or substantially no nitrogen. In certain embodiments, the metallic material layer 140 includes at least one or more AlSc alloys, or one or more types of phases such as $Al_2Sc$, $AlSc$ or $AlSc_2$. In some embodiments, the metallic material layer 140 may function as the gate layer.

It should be noted that, in accordance with some embodiments of the disclosure, the respective depositions of the semiconductor material layer 120, the ferroelectric material layer 130 and the metallic material layer 140 may be performed in-situ in the same deposition chamber. In other words, if the semiconductor material layer 120 is formed by PVD in a PVD chamber, the respective depositions of the ferroelectric material layer 130 and the metallic material layer 140 include performing a PVD process. Alternately, if the semiconductor material layer 120 is formed by PECVD in a PECVD chamber, the respective depositions of the ferroelectric material layer 130 and the metallic material layer 140 include performing a PECVD process. In some embodiments, the depositions of the semiconductor material layer 120, the ferroelectric material layer 130 and the metallic material layer 140 are performed in-situ as stages of a continuous deposition procedure. By fine-tuning the deposition parameters and reaction conditions, the semiconductor material layer 120, the ferroelectric material layer 130 and the metallic material layer 140 are sequentially and continuously formed in-situ in the same chamber without significant interfaces therebetween. In the embodiments of the present disclosure, the term "layer" in the material layer is not intended to limit or define the shape of the material as a sheet but refer to a quantity of the material. In the above-mentioned embodiments, through the same continuous deposition procedure, the aforementioned depositions are performed with the same or similar reactants in varying stoichiometric ratios under different reaction conditions. The resultant material layers, especially the semiconductor material layer 120, the ferroelectric material layer 130, are formed with compositional gradient regions, and the constituents may gradually vary from one layer to another layer. For example, the atomic ratio or content of a certain element (such as scandium) may gradually increase among the deposited layers. In certain embodiment, the semiconductor material layer 120, the ferroelectric material layer 130 and the metallic material layer 140 are grown in-situ in the same one chamber using a single deposition tool.

Figure 3:
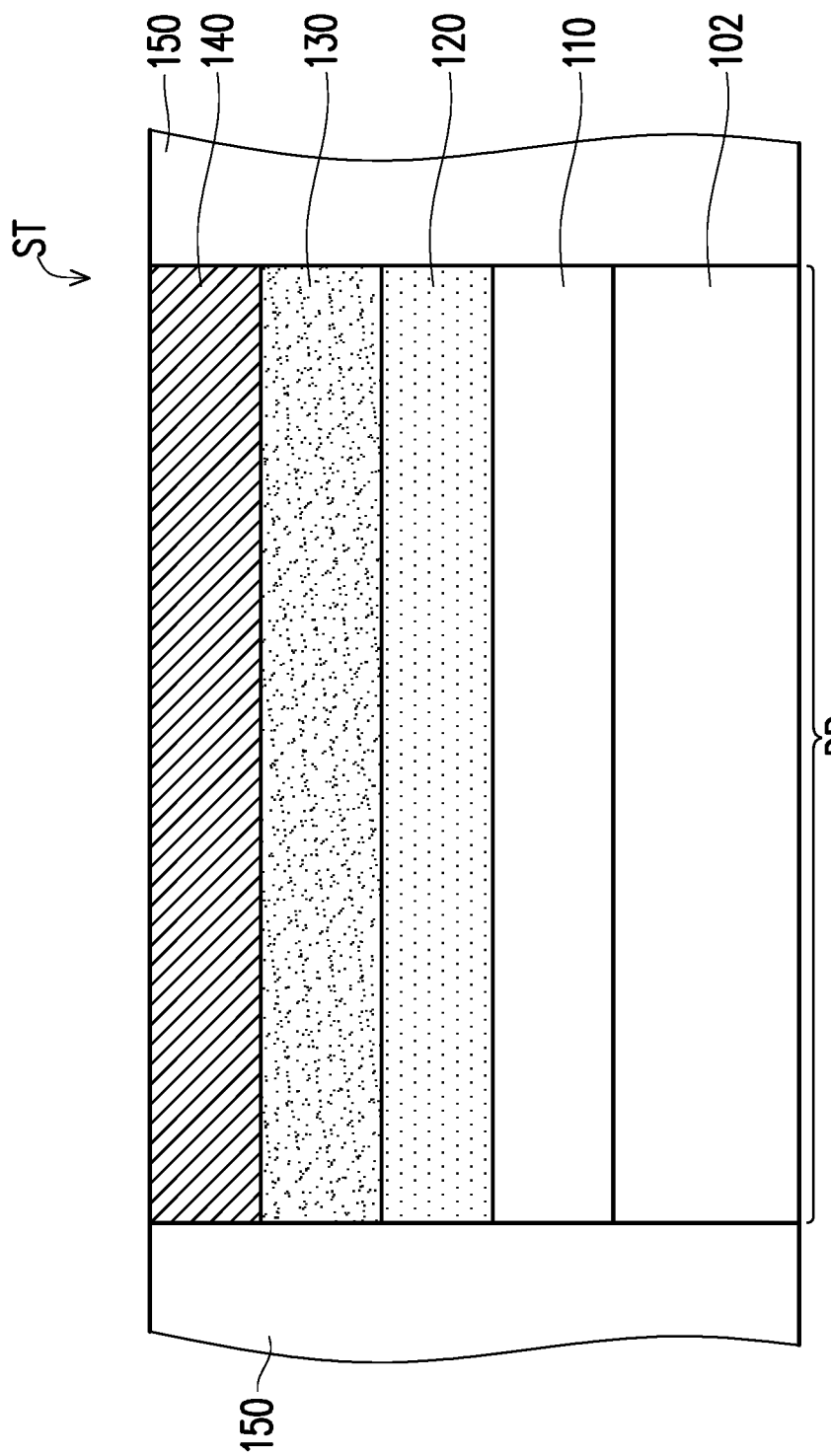

Referring to FIG. 3, in some embodiments, more than one isolation structures 150 are formed in the layer stack structure ST to define a device region DR. In certain embodiments, the isolation structures 150 are trench isolation structures extending through the multi-layer stack of the metallic material layer 140, the ferroelectric material layer 130 and the semiconductor material layer 120 and into the semiconductor substrate 100. In other embodiments, the isolation structures 150 include local oxidation of silicon (LOCOS) structures. The insulator material of the isolation structures 150 may include silicon oxide, silicon nitride, silicon oxynitride, a spin-on dielectric material, or a low-k dielectric material. In some embodiment, the insulator material may be formed by CVD such as high-density-plasma chemical vapor deposition (HDP-CVD) and sub-atmospheric CVD (SACVD) or formed by spin-on.

Figure 4:
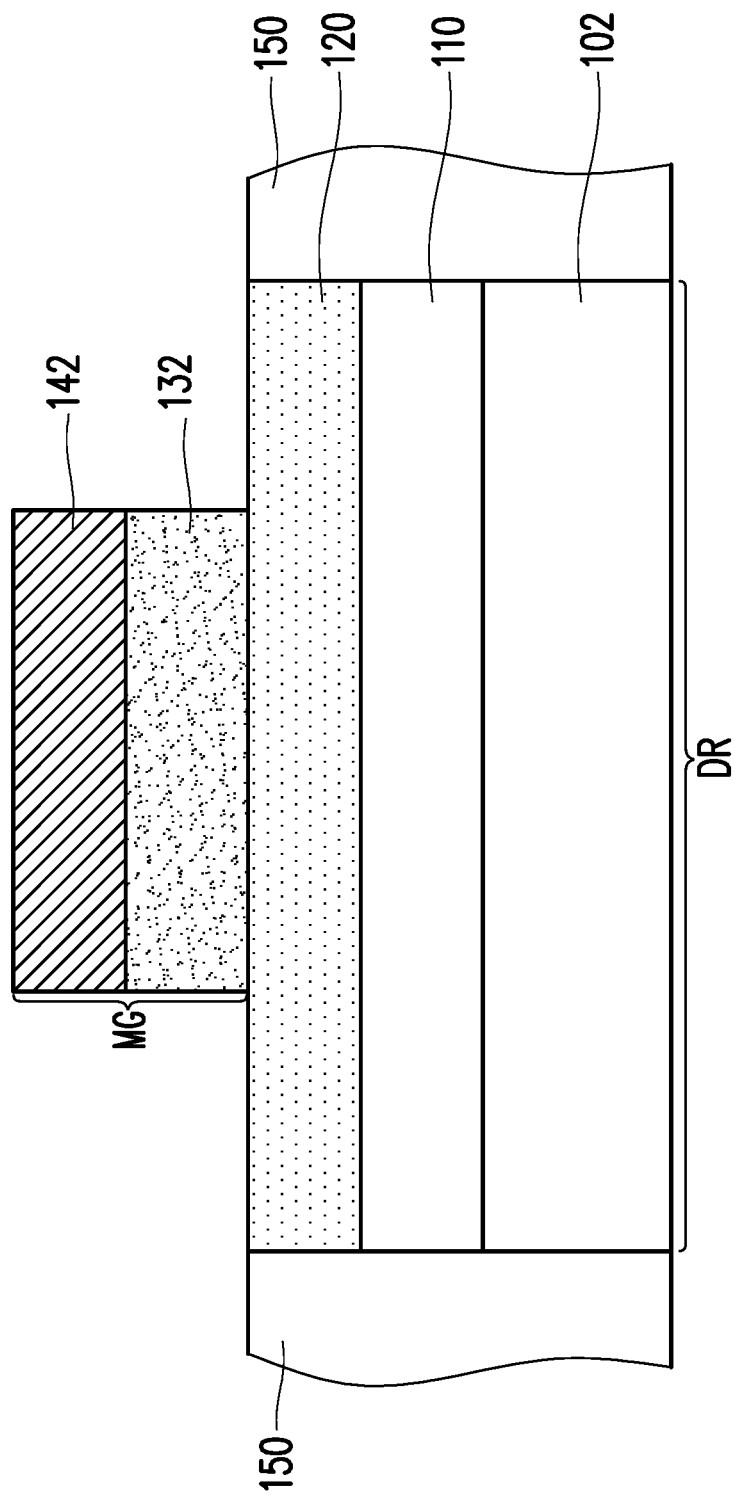

Referring to FIG. 4, in some embodiments, a patterning process is performed to the stack structure ST, and the metallic material layer 140 and the ferroelectric material layer 130 are patterned respectively into a gate layer 142 and a ferroelectric layer 132. The gate layer 142 and the ferroelectric layer 132 form a gate structure MG located on the semiconductor material layer 120 and over the oxide layer 110 and the substrate 102. During the patterning process, not only portions of the metallic material layer 140 and the ferroelectric material layer 130 but also the adjacent portions of the isolation structures 150 are removed. That is, the top surface 150t of the patterned portions of the isolation structures 150 are levelled with the top surface 120t of the semiconductor material layer 120. The gate structure MG is located within the device region DR and located between the isolation structures 150. In some embodiments, the gate layer 142 and the ferroelectric layer 132 are patterned into the gate structure MG in a single patterning process. In some embodiments, the gate layer 142 and the ferroelectric layer 132 are patterned into the gate structure MG sequentially through multiple patterning processes. As shown in FIG. 4, in some embodiments, the gate structure MG is disposed on the semiconductor material layer 120 with portions of the semiconductor material layer 120 exposed. The sidewalls of the gate structure MG in FIG. 4 may be shown to be vertically aligned or coplanar, and gate structure MG may be shown to be patterned into substantially the same pattern design or configuration. However, it is understood that the various layers of the gate structure MG may have different patterns or configurations depending on product designs. In some embodiments, the patterning and the formation of the gate structure MG include performing a photolithographic process and an anisotropic etching process. In some embodiments, a photoresist pattern (not shown) may be used as an etching mask so that portions of the metallic material layer 140 and the ferroelectric material layer 130 as well as the isolation structures 150 uncovered by the photoresist pattern are removed during the etching process, and the photoresist pattern is subsequently removed thorough a stripping process.

Figure 5:
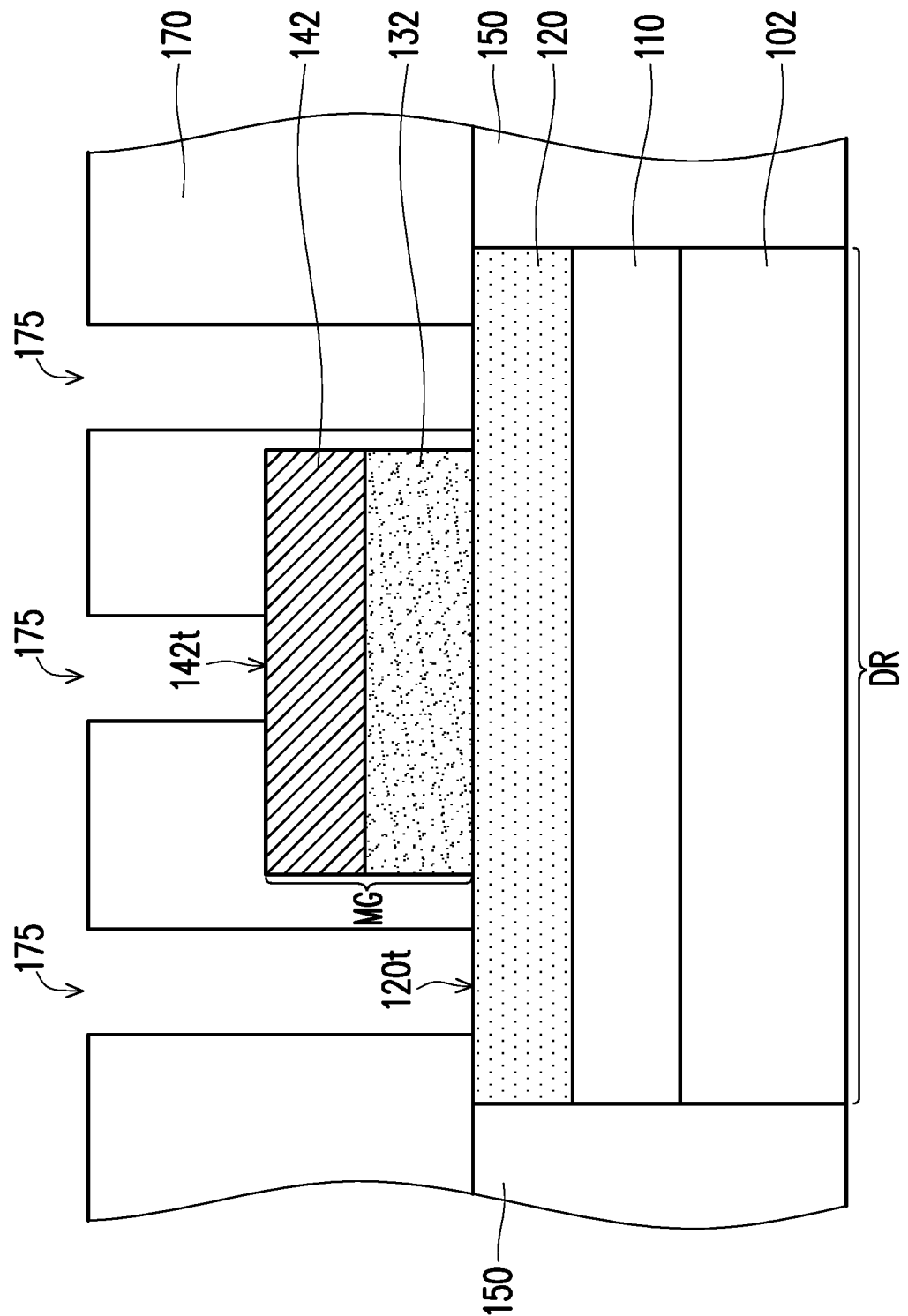

Referring to FIG. 5, an insulating layer 170 is formed over the semiconductor material layer 120 and the isolation structures 150 and fully covering the gate structure MG. In some embodiments, the material of the insulating layer 170 may include silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), bis-benzocyclobutenes (BCB) or a combination thereof. It is understood that the insulating layer 170 may include one or more insulating materials or one or more insulating layers. In some embodiments, the insulating layer 170 is formed to a suitable thickness through CVD (such as flowable CVD (FCVD), PECVD, high Density Plasma CVD (HDPCVD), SACVD and LPCVD), spin-on coating, or other suitable methods. Optionally, an etching or polishing process may be performed to reduce the thickness of the insulating layer 170 to a desirable thickness.

In FIG. 5, contact openings 175 are formed in the insulating layer 170 exposing the semiconductor material layer 120 and the gate layer 142 of the gate structure MG. That is, a top surface 142t of the gate layer 142 and top surfaces 120t of the semiconductor material layer 120 are exposed through contact openings 175. In some embodiments, the formation of the contact openings 175 includes forming a patterned mask layer (not shown) over the insulating layer 170, and anisotropic etching the insulating layer 170 using the patterned mask layer as a mask to form contact openings 175 exposing the semiconductor material layer 120 and the gate layer 142. As seen in FIG. 5, the contact openings 175 are shown with substantially vertical sidewalls. It is understood that the contact openings 175 may be formed with tapered or slant sidewalk within process variations.

Figure 6:
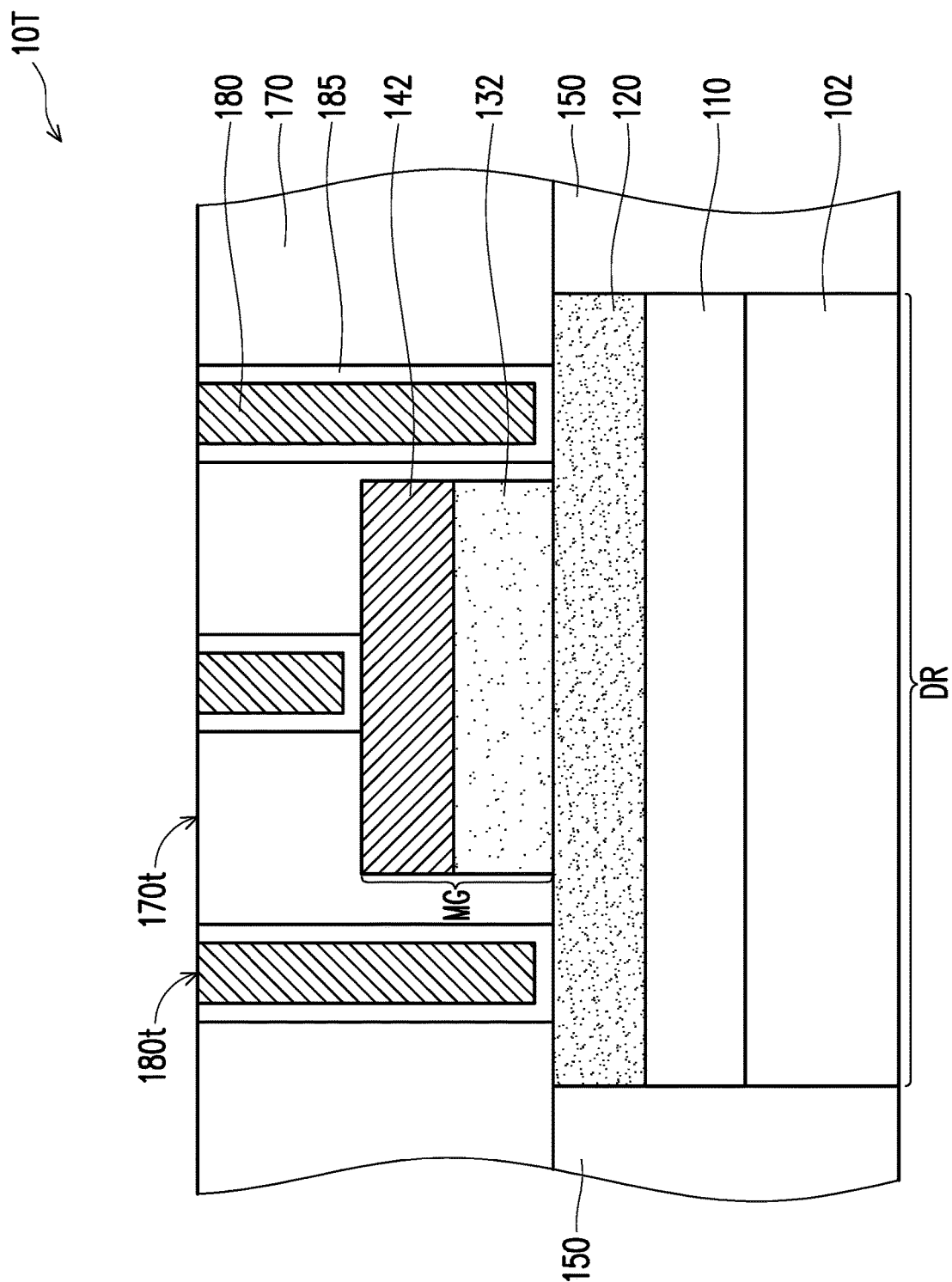

Thereafter, in FIG. 6, contacts 180 are formed in the contact openings 175. In some embodiments, a barrier layer 185 is deposited over the contact openings 175 and conformally covers the sidewalls and bottoms of the contact openings 185. In some embodiments, a seed layer (not shown) may be formed over the contact openings 175 and on the barrier layer 185. In some embodiments, the barrier layer 185 is formed to prevent out-diffusion of the metallic material of the metallic contacts. After the barrier layer 185 is formed to cover the sidewalls and the bottoms of the contact openings 175, metallic contacts 180 are then formed on the barrier layer 185 within the contact openings 175 and fill the contact openings 175. In some embodiments, a barrier material (not shown) and optionally a seed material (not shown) are sequentially formed over the contact openings 175 and conformally covering the exposed surfaces of the contact openings 175, and a metallic material (not shown) is then filled into the contact openings 175 and fills up the contact openings 175 to form the metallic contacts 180. The barrier material, the seed material and the metallic material may individually include one or more materials selected from tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the metallic material is formed by CVD or PVD. In alternative embodiments, the formation of the metallic material may include performing a plating process (such as, electrochemical plating (ECP)). In some embodiments, the barrier material includes titanium nitride (TiN)

formed by MOCVD process, the seed material includes tungsten formed by CVD, and the metallic material includes tungsten formed by the CVD process (especially tungsten CVD processes). For example, the contacts 180 include a tungsten contact and the barrier layer 185 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. As shown in FIG. 6, the top surface 170t of the insulating layer 170 is substantially flush with and levelled with the top surfaces 180t of the contacts 180. In some embodiments, the contacts 180 located on opposite sides of the gate structure MG function as the source and drain terminals of the transistor, and the contact(s) 180 connected to the gate structure MG functions as a gate contact.

In FIG. 6, a transistor structure 10T is obtained. The transistor structure 10T includes the gate structure MG having the gate layer 142 and the ferroelectric layer 132 (as the gate dielectric layer), the semiconductor material layer 120 (as the channel region) and the oxide layer 110 sequentially located on the substrate 102 from the top to the bottom, and the contacts 180 (as the source and drain terminals) located on opposite sides of the gate structure MG. The semiconductor material layer 120 functions as a conducting channel region, and is connected to the contacts 180 at opposite sides of the gate structure MG functioning as the source and drain terminals. In some embodiments, the transistor structure 10T is a front-gated transistor structure. In one embodiment, the transistor structure 10T includes a ferroelectric transistor. The described methods and structures may be formed compatible with the current semiconductor manufacturing processes. In some embodiments, the described methods and structures are formed during front-end-of-fine (FEOL) processes. In some other embodiments, the described methods and structures may be formed during middle-of-line processes or even back-end-of-line (BEOL) processes.

Figure 7:
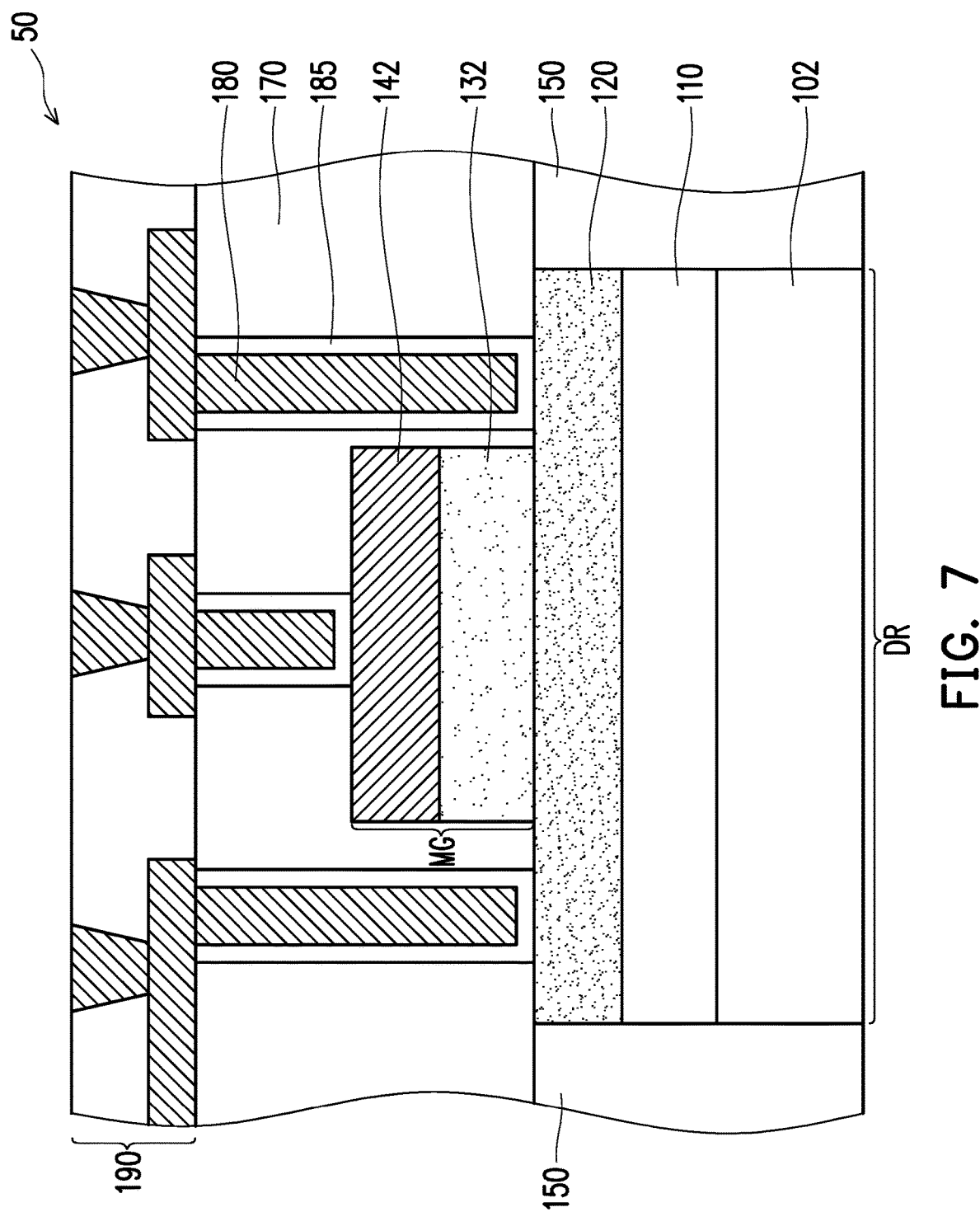

Referring to FIG. 7, in certain embodiments, an interconnect structure 190 is formed on the transistor structure 10T, and a semiconductor device structure 50 is formed. In some embodiments, the interconnect structure 190 includes one or multi-leveled routing lines and may be in direct contact with the contacts 180 and/or electrically connected with the contacts 180 of the transistor structure 10T, so that the transistor structure 10T is electrically connected further to other components or devices. It is understood that the number and configurations of the routing lines of the interconnect structure 190 shown in FIG. 7 are merely for illustration, more of the routing lines may be formed in accordance with actual design requirements.

The semiconductor device structure 50 illustrates an integrated circuit, or portion thereof. In some embodiments, the semiconductor device structure 50 comprises active devices such as oxide semiconductor thin film transistors, high voltage transistors, and/or other suitable components. In some embodiments, the semiconductor device structure 50 additionally includes passive components, such as resistors, capacitors, inductors, and/or fuses. In some embodiments, additional steps may be provided before, during, and after the process steps depicted from FIG. 1 to FIG. 7, and some of the steps described above may be replaced or eliminated, for additional embodiments of the method.

FIG. 8 through FIG. 13 are schematic cross-sectional views illustrating various stages in a fabrication method of another semiconductor device in accordance with some embodiments of the disclosure.

Figure 8:
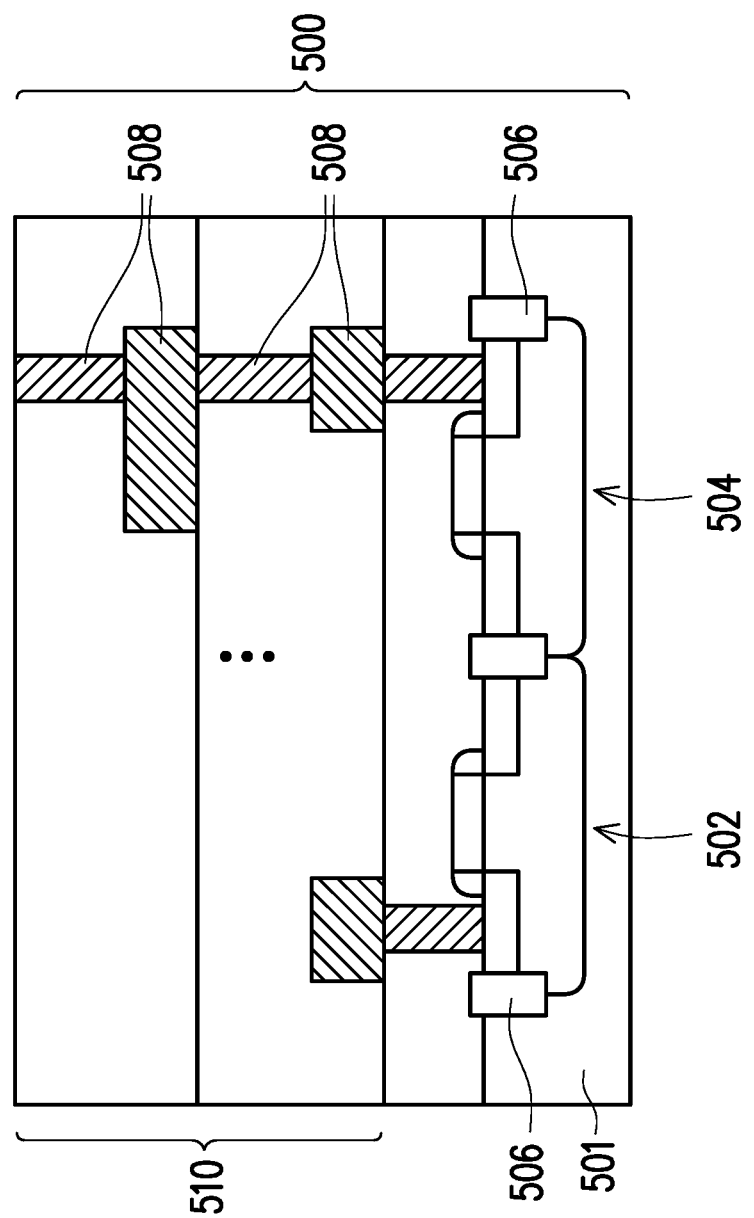
FIG. 8 through FIG. 13 are schematic cross-sectional views illustrating various stages in a fabrication method of another semiconductor device in accordance with some embodiments of the disclosure.

Referring to FIG. 8, in some embodiments, a substrate 500 for further processing is provided. In some embodiments, the substrate 500 includes a semiconductor substrate 501. In one embodiment, the semiconductor substrate 501 comprises a crystalline silicon substrate or a doped semiconductor substrate (e.g., p-type semiconductor substrate or n-type semiconductor substrate). In some alternative embodiments, the semiconductor substrate 501 is made of other suitable elemental semiconductor, compound semiconductor, or alloy semiconductor.

In some embodiments, as shown in FIG. 8, the substrate 500 includes transistors such as a NMOS 502 and a PMOS 504 formed in the semiconductor substrate 501. In one embodiment, the NMOS 502 and/or the PMOS 504 are formed following the complementary MOS (CMOS) processes. As shown in FIG. 8, in some embodiments, more than one isolation structures 506 are formed in the semiconductor substrate 501. For instance, the isolation structures 506 may be substantially the same or similar to the isolation structures 150 of the transistor structure 10T shown in FIG. 3. In some embodiments, the transistors such as the NMOS 502 and the PMOS 504 and the isolation structures 506 are formed in the substrate 500 during the front-end-of-line (FEOL) processes. In some other embodiments, the substrate 500 also includes one or more active component such as transistors, diodes, optoelectronic devices and/or one or more passive components such as capacitors, inductors and resistors.

In some embodiments, the substrate 500 includes metallization structures 508 embedded in an insulation layer 510. As shown in FIG. 8, the insulation layer 510 and the metallization structures 508 are located over the transistors 502, 504 formed in the semiconductor substrate 501. In some embodiments, the insulation layer 510 includes one or more dielectric layers. In some embodiments, the metallization structures 508 include interconnect structures, such as metal lines, vias and contact plugs. In some embodiments, the transistors 502, 504 are electrically connected with the metallization structures 508, and some of the transistors are further electrically interconnected through the metallization structures 508. The metallization structures 508 shown herein are merely for illustrative purposes and the metallization structures 508 may include other configurations and may include one or more through vias and/or damascene structures.

Figure 9:
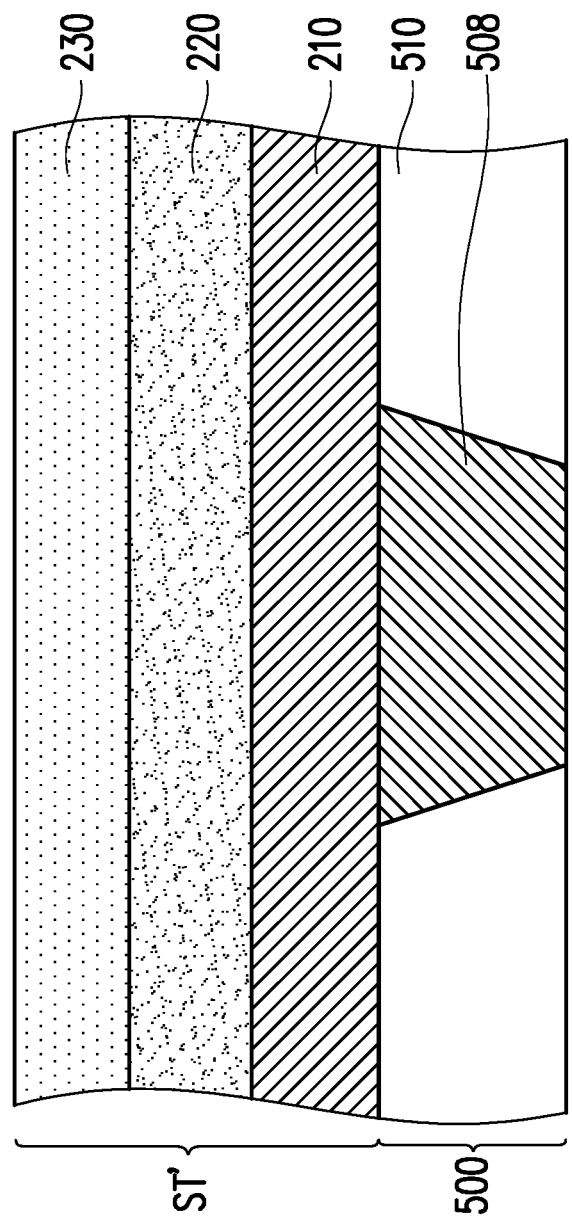

Referring to FIG. 9, a layer stack structure ST' is formed over the substrate 500 within a device region DR'. For example, the layer stack structure ST' may be formed over a portion of the metallization structures 508 and a portion of the insulation layer 510. In FIGS. 9-13, only a portion of the substrate 500 (i.e., the device region DR') is shown for illustration purposes. Herein the portion of metallization structures 508 on which the layer stack structure ST' formed may be optional and representatively shown for electrical connection purposes. It is understood that the number or the configuration of the metallization structures 508 should not be limited by the exemplary embodiments or drawings of this disclosure.

In FIG. 9, a metallic material layer 210 is blanketly formed over the portion of the metallization structures 508 and the portion of the insulation layer 510. In one embodiment, the metallic material layer 210 is in direct contact with the portion of the metallization structures 508. In some embodiments, the metallic material layer 210 may be formed by possible process described above with reference to the metallic layer 140 of FIG. 2, and the description is not repeated herein. In some embodiments, the metallic material layer 210 is made of aluminum scandium (AlSc) alloy. Similar to the metallic material layer 140 shown in FIG. 2, the metallic material layer 210 may be an AlSc alloy layer. Alternatively, the metallic material layer 210 may include at least one or more AlSc alloys, or one or more types of phases such as $Al_2Sc$, AlSc or $AlSc_2$.

Still referring to FIG. 9, in some embodiments, a ferroelectric material layer 220 is blanketly formed over the metallic material layer 210. In some embodiments, the ferroelectric material layer 220 may be formed by possible process described above with reference to the ferroelectric material layer 130 of FIG. 2, and the description is not repeated herein. Further, in some embodiments, a material of the ferroelectric material layer 220 is substantially the same or similar to the material of the ferroelectric material layer 130 shown in FIG. 2. For example, the ferroelectric material layer 220 may include rare-earth-doped Group III-nitrides, such as scandium-doped Group III-nitrides. In one embodiment, the ferroelectric material layer 220 is made of aluminum scandium nitride (AlScN). In addition, the ferroelectric material layer 220 may be formed as a single layer or multiple layers with varying Sc contents or Sc content gradients. For example, a scandium (Sc) content of the AlScN layer 220 may range from about 10% to about 60%.

In some embodiments, after forming the ferroelectric material layer 220, a semiconductor material layer 230 is formed over the ferroelectric material layer 220, and the metallic material layer 210, the ferroelectric material layer 220, the semiconductor material layer 230 are collectively referred to as the layer stack structure ST'. In some embodiments, the semiconductor material layer 230 may be formed by possible process described above with reference to the semiconductor material layer 120 of FIG. 2, and the description is not repeated herein. Further, in some embodiments, a material of the semiconductor material layer 230 is substantially the same or similar to the material of the semiconductor material layer 120 shown in FIG. 2, such as p-type oxide semiconductor material. For example, the semiconductor material layer 230 may include a rare-earth-doped Group III-oxycarbides or a rare-earth-doped Group III-oxysulfides, such as scandium-doped Group III-oxycarbides or scandium-doped Group III-oxysulfides. In some embodiment, the semiconductor material layer 230 is made of aluminum scandium oxycarbide (AlScOC), aluminum scandium oxysulfide (AlScOS), or the like. In addition, the semiconductor material layer 230 may be formed as a single layer or multiple layers with varying Sc contents or Sc content gradients. For example, a scandium (Sc) content of the AlScOC (or AlScOS) layer 230 may range from about 10% to about 50%.

It should be noted that, in accordance with some embodiments of the disclosure, the respective depositions of the metallic material layer 210, the ferroelectric material layer 220 and the semiconductor material layer 230 may be performed in-situ in the same deposition chamber. In some embodiments, the depositions of the metallic material layer 210, the ferroelectric material layer 220 and the semiconductor material layer 230 are performed in-situ as stages of a continuous deposition procedure. By fine-tuning the deposition parameters and reaction conditions, the metallic material layer 210, the ferroelectric material layer 220 and the semiconductor material layer 230 are sequentially and continuously formed in-situ in the same chamber without significant interfaces therebetween. In the above-mentioned embodiments, through the same continuous deposition procedure, the aforementioned depositions are performed with the same or similar reactants in varying stoichiometric ratios under different reaction conditions. The resultant material layers, especially the semiconductor material layer 230, the ferroelectric material layer 220, are formed with compositional gradient regions, and the constituents may gradually vary from one layer to another layer. For example, the atomic ratio or content of a certain element (such as scandium) may gradually increase among the deposited layers. In certain embodiment, the metallic material layer 210, the ferroelectric material layer 220 and the semiconductor material layer 230 are grown in-situ in the same one chamber using a single deposition tool.

Figure 10:
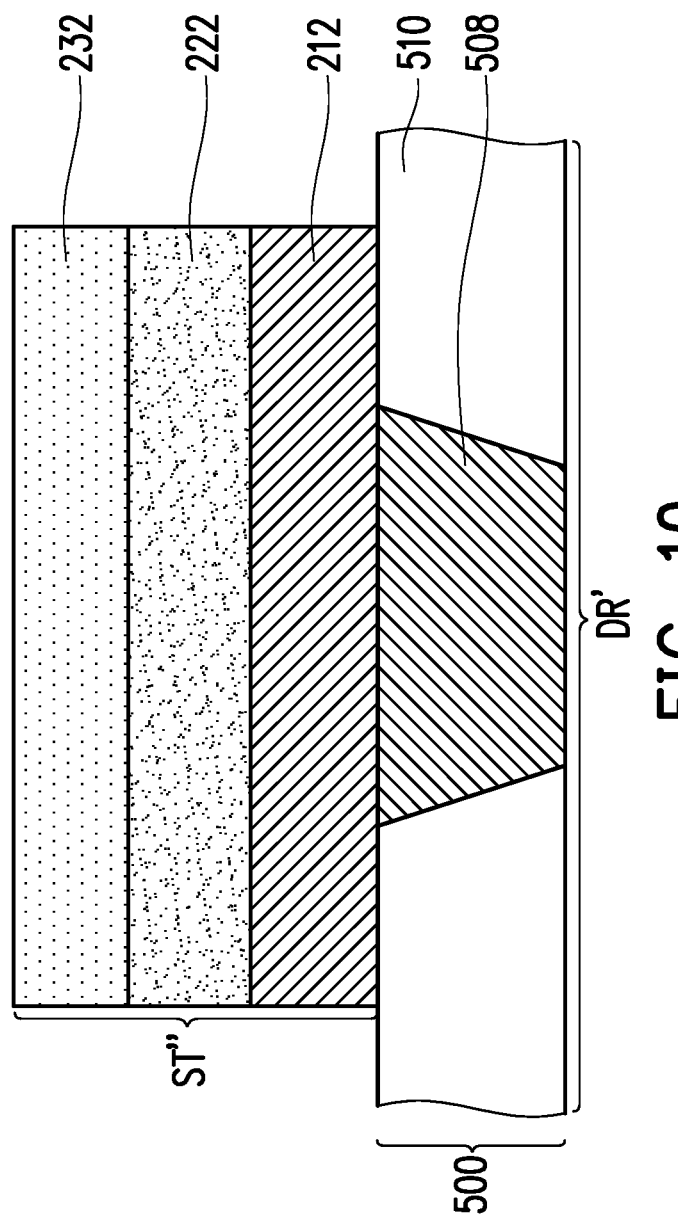

Referring to FIG. 10, in some embodiments, a patterning process is performed to the layer stack structure ST' of the metallic material layer 210, the ferroelectric material layer 220, and the semiconductor material layer 230, so that the layer stack structure ST' is patterned to form a layer stack structure ST" having a gate layer 212, a ferroelectric layer 222, and a semiconductor layer 232 stacked in sequence from the bottom to the top. In some embodiments, the layer stack structure ST' of the metallic material layer 210, the fennel ectric material layer 220, and the semiconductor material layer 230 is patterned into the layer stack structure ST" in one continuous patterning process or sequentially patterned through multiple patterning processes. As shown in FIG. 10, the patterned layer stack structure ST" is disposed on the portion of the metallization structures 508, exposing the substrate 500. Sidewalls of the layer stack structure ST" in FIG. 10 may be shown to be vertically aligned or coplanar, and the layer stack structure ST" may be shown to be patterned into substantially the same pattern design or configuration. However, it is understood that the various layers of the layer stack structure ST" may have different patterns or configurations depending on product designs. In some embodiments, the patterning and the formation of the layer stack structure ST" include performing a photolithographic process and an anisotropic etching process. In some embodiments, a photoresist pattern (not shown) may be used as an etching mask so that portions of the layer stack structure ST' uncovered by the photoresist pattern are removed during the etching process, and then the photoresist pattern is removed thorough a stripping process.

Figure 11:
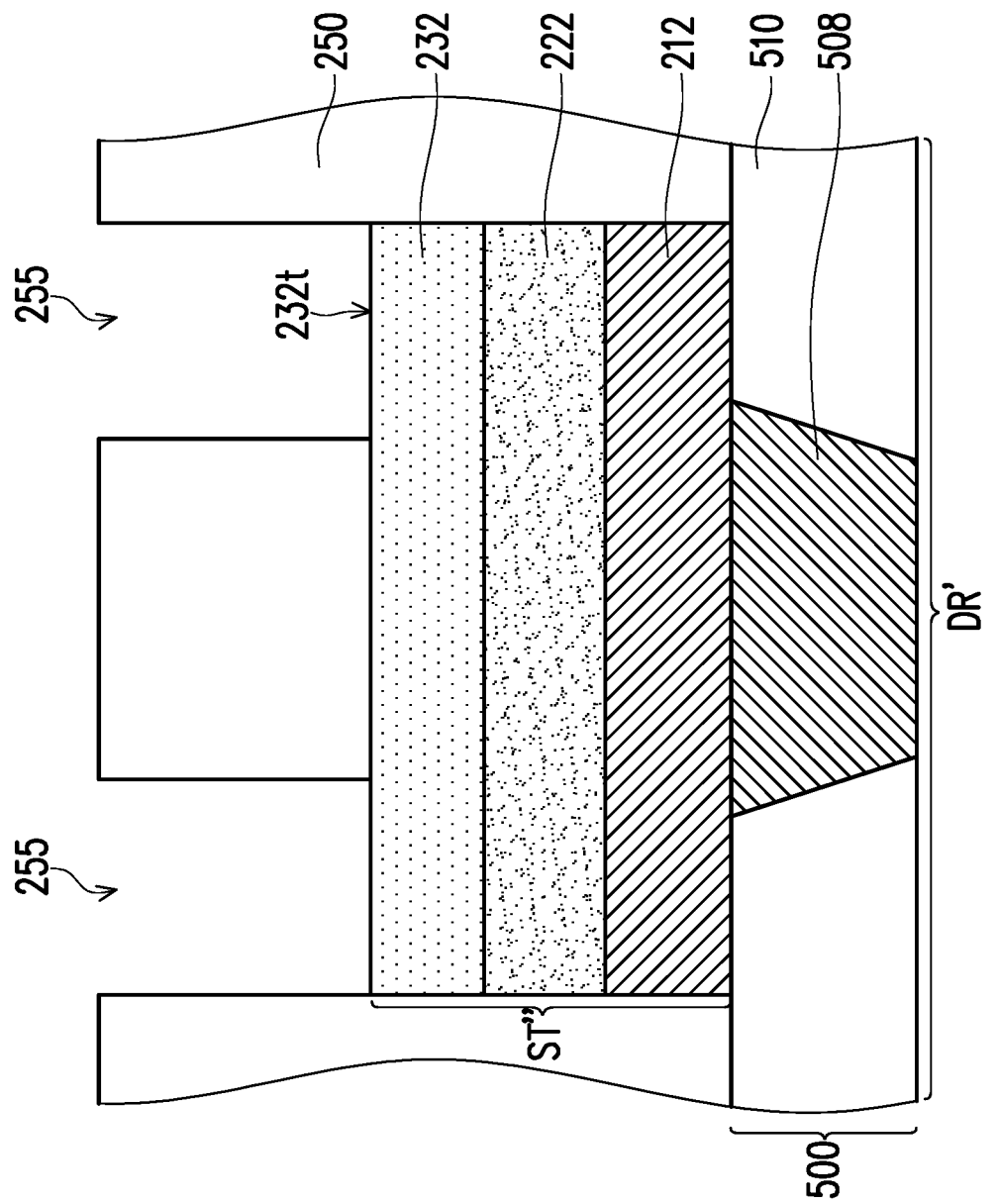

Referring to FIG. 11, an interlayer dielectric (ILD) layer 250 with contact openings 255 is formed over the substrate 500. In some embodiments, the material of the ILD layer 250 includes silicon oxide, silicon nitride, silicon oxynitride, or one or more low-k dielectric materials. It is understood that the ILD layer 250 may include one or more dielectric materials or one or more dielectric layers. In some embodiments, the layer 250 is formed to a suitable thickness through CND (such as FCVD, PECVD, HDPCVD, SACVD and LPCVD), spin-on coating, or other suitable methods. For example, the ILD layer 250 may be formed by PECVD to cover the exposed substrate 500 and the layer stack structure ST" of the gate layer 212, the ferroelectric layer 222, and the semiconductor layer 232. Later, the contact openings 255 are formed in the ILD layer 250 exposing the semiconductor layer 232. For example, the formation of the contact openings 255 may include forming a patterned mask layer (not shown) over the ILD layer 250, anisotropic etching the ILD layer 250 using the patterned mask layer as a mask to form contact openings 255 exposing top surface 232t of the semiconductor layer 232. As illustrated in FIG. 11, the contact openings 255 are shown with substantially vertical sidewalls. It is understood that the contact openings may be formed with slant sidewalls within process variations.

Figure 12:
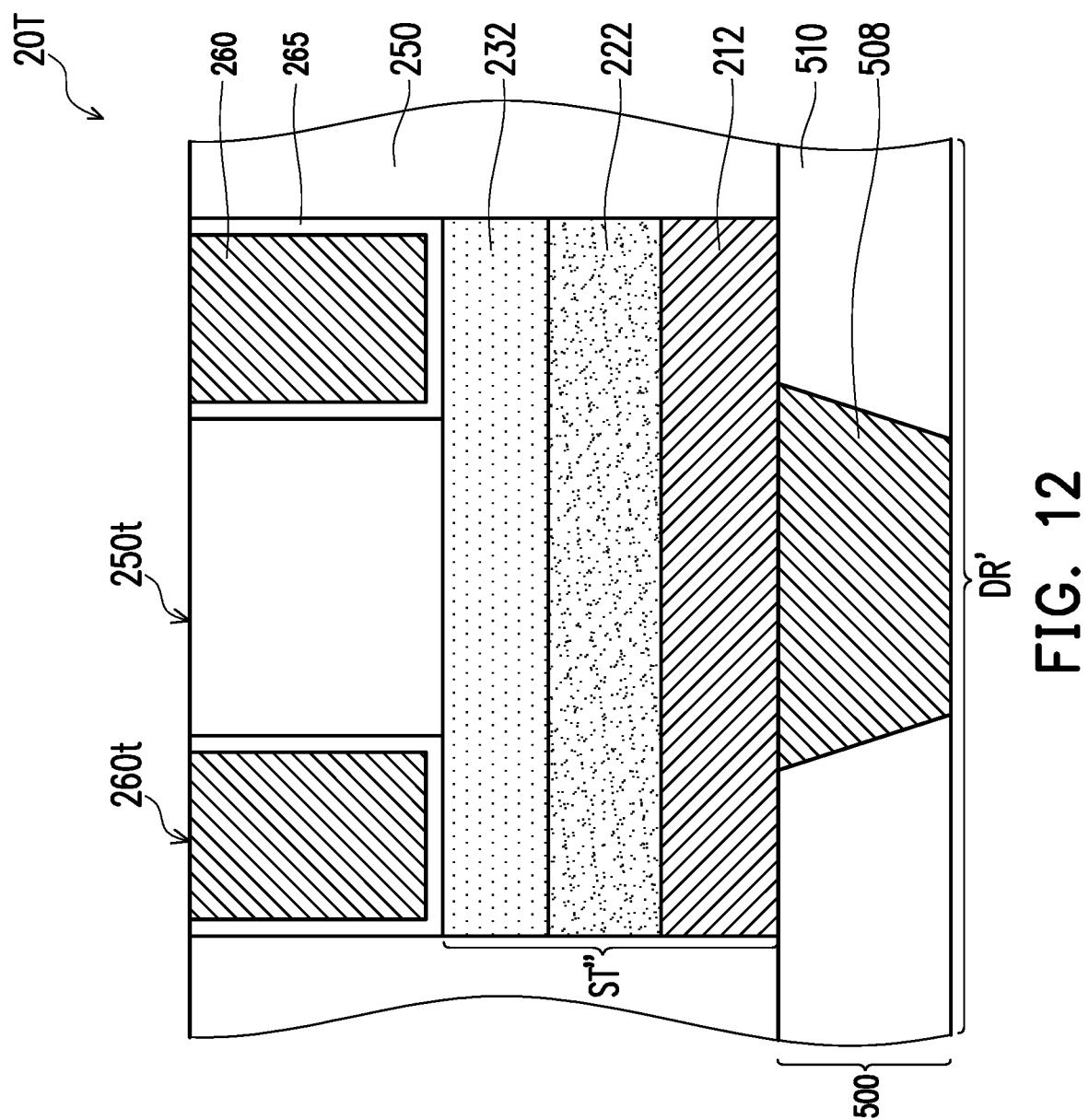

Thereafter, in FIG. 12, contacts 260 are formed in the contact openings 255 and are in direct contact with the semiconductor layer 232. In some embodiments, a barrier layer 265 is deposited over the contact openings 255 and conformaily covers the sidewalls of the contact openings 255 and covers the top surface 232t of the semiconductor layer 232. In some other embodiments, a seed layer (not shown) is formed over the contact openings 255 and on the barrier layer 265. The barrier layer 265 is formed to prevent out-diffusion of the metallic material of the metallic contacts. After the barrier layer 265 is formed to cover the sidewalls and the bottoms of the contact openings 255, metallic contacts 260 are then formed on the harrier layer 265 within the contact openings 255 and fill the contact openings 255. As shown FIG. 12, the contacts 260 are formed directly on the semiconductor layer 232. In some embodiments, the barrier layer 265 and the contacts 260 may be formed by similar process described above with reference to the barrier layer 185 and the contacts 180 of FIG. 6, and the description is not repeated herein. As illustrated in FIG. 12, a top surface 250t of the ILD layer 250 is substantially flush with and levelled with top surfaces 260t of the contacts 260. In some embodiments, the contacts 260 function as the source and drain terminals of the transistor.

In FIG. 12, a transistor structure 20T is obtained. The transistor structure 201 includes the layer stack structure ST" having the gate layer 212, the ferroelectric layer 222 and the semiconductor layer 232 sequentially stacked from the bottom to the top, and the contacts 260 located on the layer stack structure ST". The semiconductor layer 232 functions as a channel layer of the transistor structure 201, and the ferroelectric layer 222 functions as a gate dielectric layer of the transistor structure 20T. In some embodiments, the transistor structure 20T is a bottom-gated transistor structure or a back-gate transistor structure. In one embodiment, the transistor structure 20T includes a ferroelectric transistor. In the illustrated embodiments, the described methods and structures may be formed compatible with the current semiconductor manufacturing processes. In some embodiments, the described methods and structures are formed during back-end-of-line (BEOL) processes. In some embodiments, the described methods and structures may be formed during middle-of-line processes.

Figure 13:
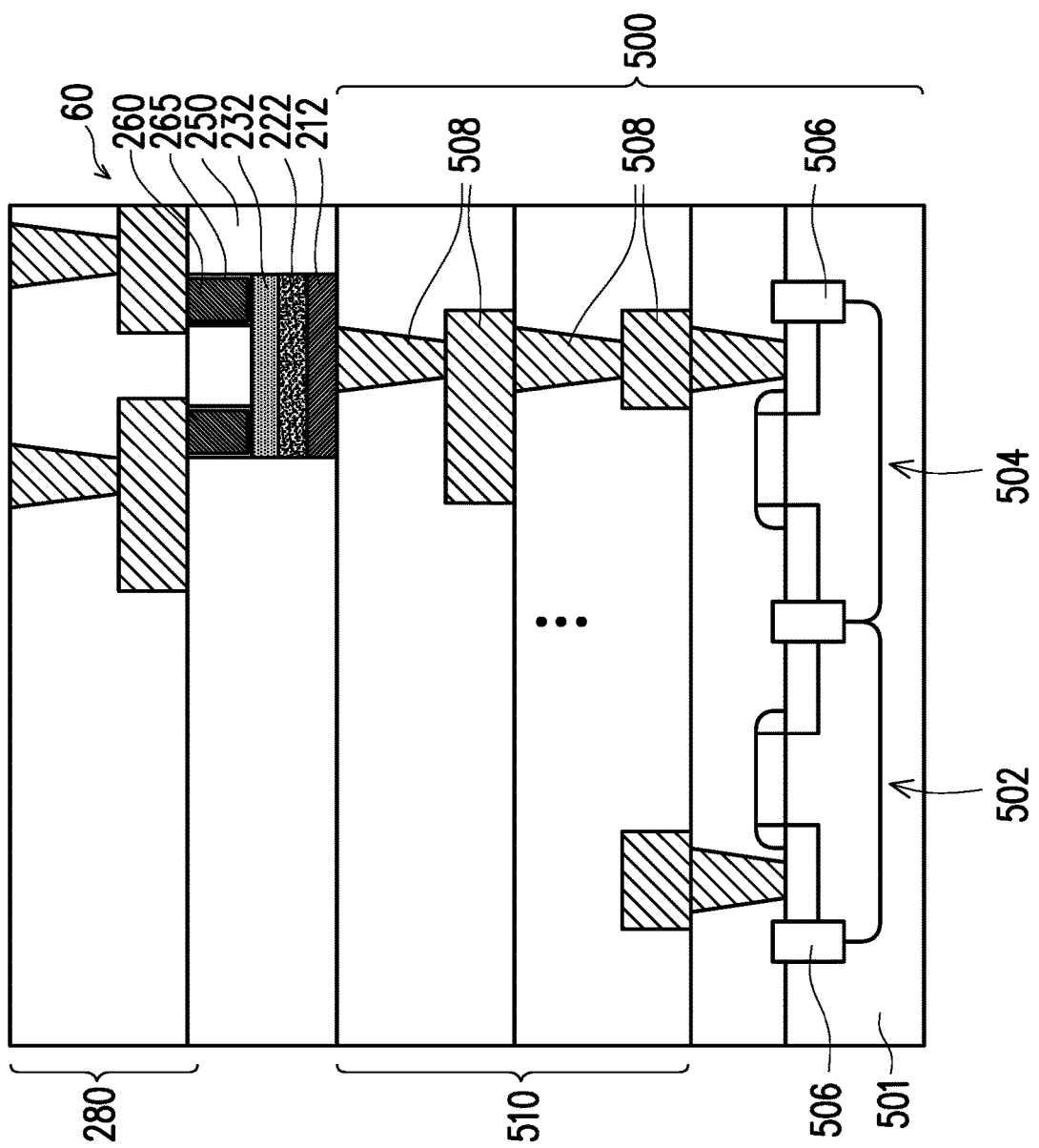

Referring to FIG. 13, in certain embodiments, an interconnect structure 280 is formed on the ILD layer 250 and over the contacts 260, and thus a semiconductor device structure 60 is formed. In some embodiments, the interconnect structure 280 includes one or multi-leveled routing lines and is in direct contact with the contacts 260 and/or electrically connected with the contacts 260 of the transistor structure 20T, so that the transistor structure 20T is electrically connected further to other components or devices. It is understood that the number and configurations of the routing lines of the interconnect structure 280 shown in FIG. 13 are merely for illustration, more of the routing lines may be formed in accordance with actual design requirements.

The semiconductor device structure 60 illustrates an integrated circuit, or portion thereof. In some embodiments, the semiconductor device structure 60 comprises active devices such as oxide semiconductor thin film transistors, high voltage transistors, and/or other suitable components. In some embodiments, the semiconductor device structure 60 additionally includes passive components, such as resistors, capacitors, inductors, and/or fuses. In some embodiments, additional steps may be provided before, during, and after the process steps depicted from FIG. 9 to FIG. 13, and some of the steps described above may be replaced or eliminated, for additional embodiments of the method.

Figure 14:
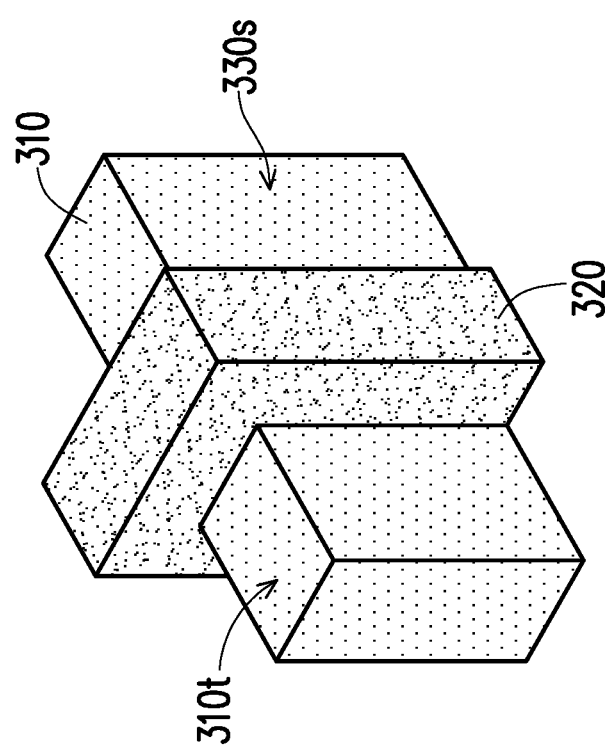
FIG. 14 and FIG. 15 are schematic three-dimensional views showing a semiconductor device in accordance with some embodiments of the disclosure.
Figure 15:
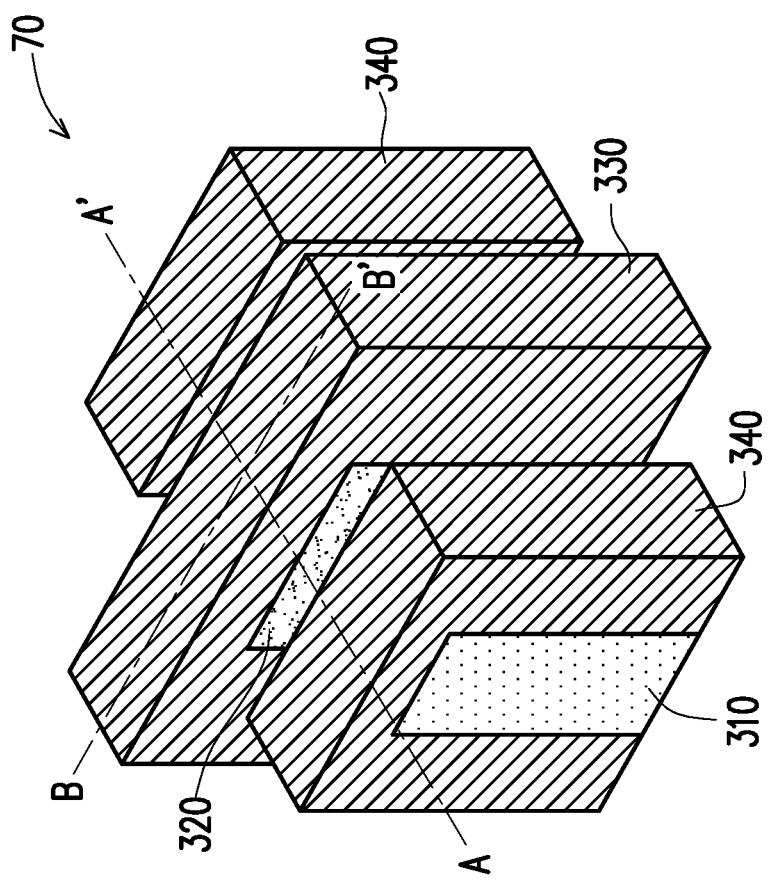
Figure 16:
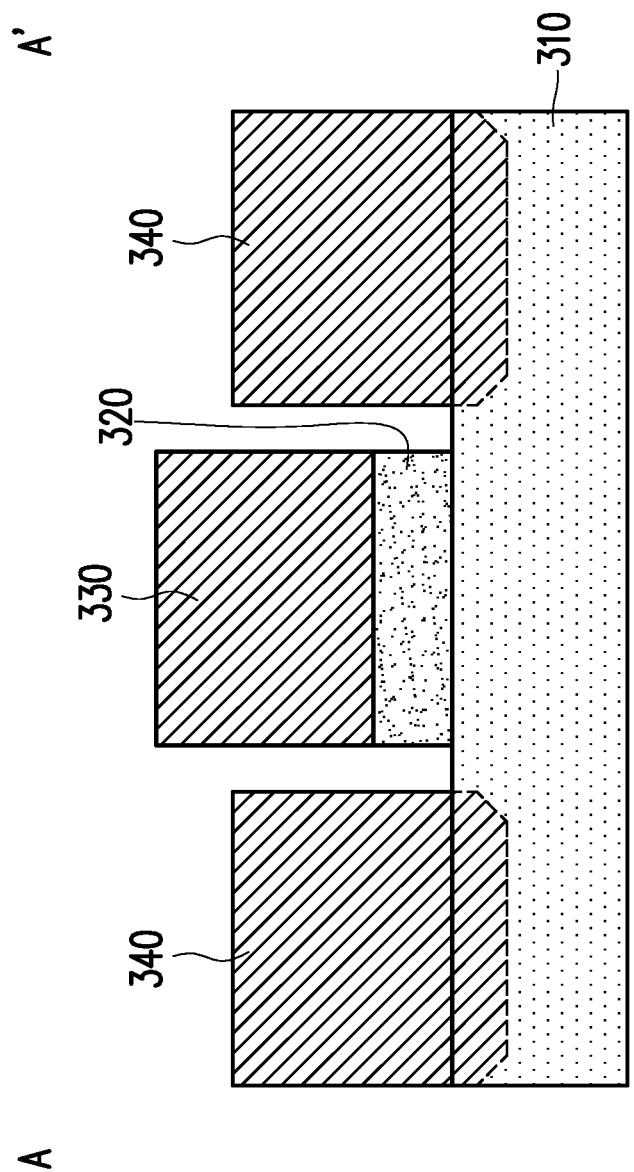
FIG. 16 and FIG. 17 are schematic cross-sectional views showing the semiconductor device in accordance with some embodiments of the disclosure.
Figure 17:
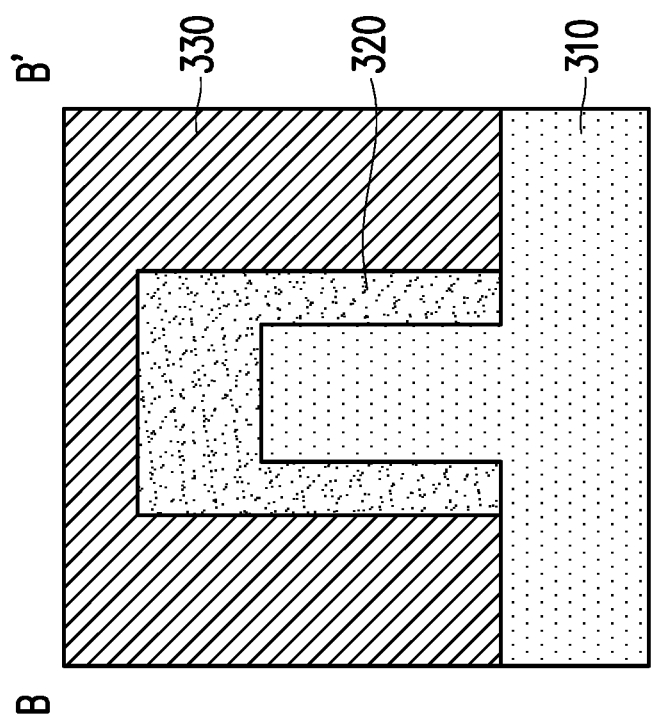

FIG. 14 and FIG. 15 are schematic three-dimensional views showing a semiconductor device in accordance with some embodiments of the disclosure. FIG. 14 shows the structure before the source and drain terminals are formed, while FIG. 15 shows the structure after the source and drain terminals are formed. FIG. 16 and FIG. 17 are schematic cross-sectional views respectively along the lines A-A' and B-B' showing the semiconductor device of FIG. 15 in accordance with some embodiments of the disclosure.

FIG. 14 illustrates a semiconductor device structure 70 in accordance with some embodiments. The semiconductor device structure 70 includes a semiconductor layer 310 and a ferroelectric layer 320 is located on and surrounds the semiconductor layer 310. Referring to FIG. 14 and FIG. 15, in some embodiments, the reverse U-shaped gate layer 330 and the reverse U-shaped ferroelectric layer 320 surround the semiconductor layer 310. In addition, the ferroelectric layer 320 occupies the interface between the semiconductor layer 310 and the gate layer 330, and extends over not just top surface 310t but also two opposite side surfaces 310s of the semiconductor layer 310. That is, the ferroelectric layer 320 covers at least three sides of the semiconductor layer 310 and is surrounded by the gate layer 330. Referring to FIG. 15, FIG. 16 and FIG. 17, a gate structure 300 of the gate layer 330 and the ferroelectric layer 320 is disposed on and surrounds the top side and the two opposite sides of the semiconductor layer 310. As illustrated in FIG. 15 and FIG. 17, in some embodiments, the gate structure 300 may shape like a reverse U shape wrapping around the semiconductor layer 310. In some embodiments, the semiconductor device structure 70 includes source and drain terminals 340 located directly on the semiconductor layer 310, and the source and drain terminals 340 each may shape like a reverse U shape wrapping around the semiconductor layer 310. In some embodiments, the source and drain terminals 340 are located at two opposite sides of the gate structure 300 and are separate from the gate structure 300 by an interlayer dielectric (ILD) layer (not shown) located therebetween. It should be appreciated that in FIGS. 15-17 the layer is not shown for simplicity. In some embodiments, the source and drain terminals 1960 may further include seed layer(s) and/or adhesion/barrier layer(s). In some embodiments, the semiconductor device structure 70 includes a double-gated transistor structure. In certain embodiments, materials of the semiconductor layer 310, the ferroelectric layer 320 and the gate layer 330 may be substantially the same or similar to those of FIG. 2 and FIG. 9, respectively.

In the above embodiments, the formation of the p-type oxide semiconductor layer/ferroelectric layer pair enhances the ferroelectric property of the ferroelectric layer. Overall, the performance of the semiconductor device is enhanced.

In accordance with some embodiments of the disclosure, a semiconductor device is described. The semiconductor device includes a gate layer, a semiconductor layer and a ferroelectric layer disposed between the gate layer and the semiconductor layer. The semiconductor layer includes a first material containing a Group III element, a rare-earth element and a Group VI element, the ferroelectric layer includes a second material containing a Group III element, a rare-earth element and a Group V element and the gate layer includes a third material containing a Group III element and a rare-earth element.

In accordance with another embodiment of the disclosure, a semiconductor device is described. The semiconductor device includes a channel layer and a gate structure over the channel layer. The gate structure includes a gate dielectric layer and a gate layer, wherein the channel layer includes a p-type oxide semiconductor material, the gate dielectric layer includes a ferroelectric material, the gate layer includes a metallic material, and each of the p-type oxide semiconductor material, the ferroelectric material and the metallic material comprises a scandium-doped material.

In accordance with yet another embodiment of the disclosure, a method of fabricating a semiconductor device is described. The method includes at least the following steps. A semiconductor substrate is provided, and a layer stack structure is formed over the semiconductor substrate. The layer stack structure includes a channel layer, a gate dielectric layer and a gate layer sequentially stacked on the semiconductor substrate. The layer stack is then patterned to form a gate structure, and source and drain terminals are formed over the channel layer, wherein the channel layer includes a scandium-doped aluminum oxycarbide layer, the gate dielectric layer includes a scandium-doped aluminum nitride layer and the gate layer includes a scandium-doped aluminum layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a gate layer;
    a semiconductor layer;
    a ferroelectric layer disposed between the gate layer and the semiconductor layer,
    wherein the semiconductor layer includes a first material containing a Group III element, a rare-earth element and a Group VI element, the ferroelectric layer includes a second material containing a Group III element, a rare-earth element and a Group V element and the gate layer includes a third material containing a Group III element and a rare-earth element; and
    source and drain terminals being in direct contact with the semiconductor layer, wherein a topmost position of an interface between the semiconductor layer and the ferroelectric layer is lower than top surfaces of the source and drain terminals, and
    wherein a content of the rare-earth element in the semiconductor layer gradually varies from a first side of the semiconductor layer to a second side of the semiconductor layer.

2. The semiconductor device of claim 1, wherein the Group III element and the rare-earth element of the first material, the Group III element and the rare-earth element of the second material and the Group III element and the rare-earth element of the third material are respectively the same.

3. The semiconductor device of claim 1, wherein first material comprises aluminum scandium oxycarbide (AlScOC), the second material comprises aluminum scandium nitride (AlScN) and the third material comprises aluminum scandium (AlSc) alloy.

4. The semiconductor device of claim 3, wherein the first material comprises AlScOC with a scandium (Sc) content ranging from about 10% to about 50%.

5. The semiconductor device of claim 3, wherein the second material comprises AlScN with a scandium (Sc) content ranging from about 10% to about 60%.

6. The semiconductor device of claim 1, wherein the ferroelectric layer and the gate layer are in a reverse U shape, and the ferroelectric layer and the gate layer extends over a top surface and opposite side surfaces of the semiconductor layer.

7. The semiconductor device of claim 1, wherein the source and drain terminals are on opposite ends of the gate layer and the ferroelectric layer, and sidewalls of the gate layer and the ferroelectric layer are in-between sidewalls of the semiconductor layer.

8. The semiconductor device of claim 1, wherein the source and drain terminals and the gate layer are on opposite sides of the semiconductor layer, and the gate layer is disposed on an interconnect structure.

9. The semiconductor device of claim 1, wherein the semiconductor device further comprises another interconnect structure dispose on and in direct contact with the source and drain terminals.

10. A method of fabricating a semiconductor device, comprising:
    providing a semiconductor substrate;
    forming a layer stack structure over the semiconductor substrate, the layer stack structure includes a channel layer, a gate dielectric layer and a gate layer sequentially stacked over one another;
    patterning the layer stack structure to form a gate structure; and
    forming source and drain terminals over the channel layer, the source and drain terminals being in contact with the channel layer, wherein the channel layer includes a scandium-doped aluminum oxycarbide layer, the gate dielectric layer includes a scandium-doped aluminum nitride layer and the gate layer includes a scandium-doped aluminum layer, a scandium content in the channel layer gradually varies from a first side of the channel layer to a second side of the channel layer, and wherein top surfaces of the source and drain terminals are located at a position higher than a topmost interface of the gate dielectric layer and the channel layer.

11. The method of claim 10, wherein the layer stack structure of the channel layer, the gate dielectric layer and the gate layer is in-situ formed in a single chamber.

12. The semiconductor device of claim 1, wherein a content of the rare-earth element in the ferroelectric layer gradually varies from a first side of the ferroelectric layer to a second side of the ferroelectric layer.

* * * * *